US012610532B2

(12) United States Patent
Han

(10) Patent No.: US 12,610,532 B2
(45) Date of Patent: Apr. 21, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei City (CN)

(72) Inventor: Qinghua Han, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 539 days.

(21) Appl. No.: 18/164,586

(22) Filed: Feb. 4, 2023

(65) Prior Publication Data

US 2023/0189509 A1 Jun. 15, 2023

Related U.S. Application Data

(63) Continuation of application No. PCT/CN2022/092200, filed on May 11, 2022.

(30) Foreign Application Priority Data

Oct. 29, 2021 (CN) .......................... 202111269832.X

(51) Int. Cl.
*H10B 12/00* (2023.01)
*H01L 23/528* (2006.01)
*H10D 89/10* (2025.01)

(52) U.S. Cl.
CPC ......... *H10B 12/482* (2023.02); *H01L 23/528* (2013.01); *H10B 12/05* (2023.02); *H10B 12/315* (2023.02); *H10D 89/10* (2025.01)

(58) Field of Classification Search
CPC ... H10B 12/482; H01L 23/5283; H10D 89/10
See application file for complete search history.

(56) References Cited

U.S. PATENT DOCUMENTS

| | | | | | |
|---|---|---|---|---|---|
| 5,396,451 | A | * | 3/1995 | Ema .................... | H10B 12/318 |
| | | | | | 365/72 |
| 6,091,094 | A | * | 7/2000 | Rupp ................... | H10B 12/395 |
| | | | | | 438/242 |
| 2005/0199913 | A1 | | 9/2005 | Hofmann | |
| 2012/0012913 | A1 | * | 1/2012 | Lee .......................... | H10D 1/68 |
| | | | | | 257/302 |
| 2013/0193398 | A1 | * | 8/2013 | Pellizzer ............... | H10B 63/80 |
| | | | | | 257/E47.001 |

FOREIGN PATENT DOCUMENTS

| | | |
|---|---|---|
| CN | 1248065 A | 3/2000 |
| CN | 1682372 A | 10/2005 |
| CN | 105448928 A | 3/2016 |
| CN | 106847754 A | 6/2017 |
| CN | 106935258 A | 7/2017 |
| CN | 112166471 A | 1/2021 |

* cited by examiner

*Primary Examiner* — Amar Movva
(74) *Attorney, Agent, or Firm* — SYNCODA LLC; Feng Ma

(57) ABSTRACT

A method for manufacturing a semiconductor structure includes: a substrate; and a plurality of parallel word lines and a plurality of parallel bit lines on the substrate. For each bit line, the bit line is in a zigzag shape, each two adjacent segments among segments of the bit line with the zigzag shape form a first angle, the bit line has at least one first angle, and the bit line intersects the word lines to form a second angle.

9 Claims, 10 Drawing Sheets

<table>
<tr><td>10</td><td>11</td><td>11</td><td>12</td><td>12</td></tr>
<tr><td>FIG. 5A</td><td>FIG. 5B</td><td>FIG. 5C</td><td>FIG. 5D</td><td>FIG. 5E</td></tr>
</table>

20

30

20

21

31

40

21

41

SEMICONDUCTOR STRUCTURE AND METHOD FOR MANUFACTURING SEMICONDUCTOR STRUCTURE

CROSS-REFERENCE TO RELATED APPLICATIONS

This is a continuation of International Patent Application No. PCT/CN2022/092200 filed on May 11, 2022, which claims priority to Chinese patent application No. 202111269832.X filed on Oct. 29, 2021. The disclosures of the above-referenced applications are hereby incorporated by reference in their entirety.

BACKGROUND

In the current method for manufacturing a $4F^2$ Dynamic Random Access Memory ($4F^2$ DRAM) with vertical transistors, word lines and bit lines intersect each other vertically, a silicon column is formed at the intersection, and a transistor and a storage capacitor are made on the silicon column. The array formed by intersecting is a tetragonal structure. However, the tetragonal structure does not have the highest area efficiency in making the storage capacitors.

SUMMARY

The present disclosure relates to, but is not limited to, a semiconductor structure and a method for manufacturing a semiconductor structure.

A first aspect of the embodiments of the present disclosure provides a semiconductor structure, which includes: a substrate; and a plurality of parallel word lines and a plurality of parallel bit lines on the substrate. For each bit line, the bit line is in a zigzag shape, each two adjacent segments among segments of the bit line with the zigzag shape form a first angle, the bit line has at least one first angle, and the bit line intersects the word lines to form a second angle.

A second aspect of the embodiments of the present disclosure provides a method for manufacturing a semiconductor structure, which includes the following operations.

A substrate is provided; and a plurality of parallel word lines and a plurality of parallel bit lines are formed on the substrate. For each bit line, the bit line is in a zigzag shape, each two adjacent segments among segments of the bit line with the zigzag shape form a first angle, the bit line has at least one first angle, and the bit line intersects the word lines to form a second angle.

BRIEF DESCRIPTION OF THE DRAWINGS

In the drawings, unless otherwise specified, the same reference numerals throughout multiple drawings represent the same or similar parts or elements. These drawings are not necessarily drawn to scale. It is to be understood that these drawings only depict some embodiments disclosed according to the present disclosure and should not be regarded as a limitation to the scope of the present disclosure.

DETAILED DESCRIPTION

Figure 1A:
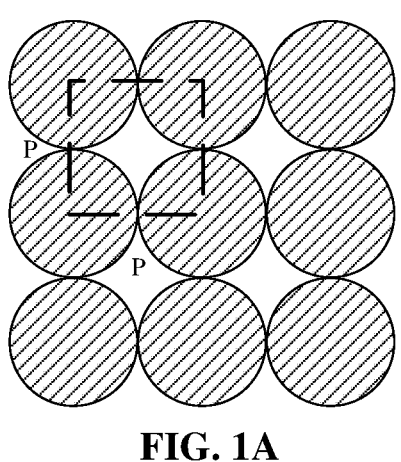
FIG. 1A is a first schematic diagram of comparison between an area of a storage unit of a tetragonal array structure and an area of a storage unit of a hexagonal close-packed structure according to an example.

For making the purpose, technical solutions and the advantages of present disclosure more clear, the present disclosure is further elaborated below in combination with the specific implementation modes and referring to the drawings. It should be understood that the description are only exemplary and are not intended to limit the scope of the present disclosure. In addition, the description of the known structure and technology is omitted in the following statements, so as to avoid unnecessary confusion with the concept of the present disclosure.

It is apparent that the described embodiments are a part of the embodiments of the present disclosure but not all. All other embodiments obtained by those of ordinary skill in the art based on the embodiments in the present disclosure without creative work shall fall within the scope of protection of the present disclosure.

Figure 1B:
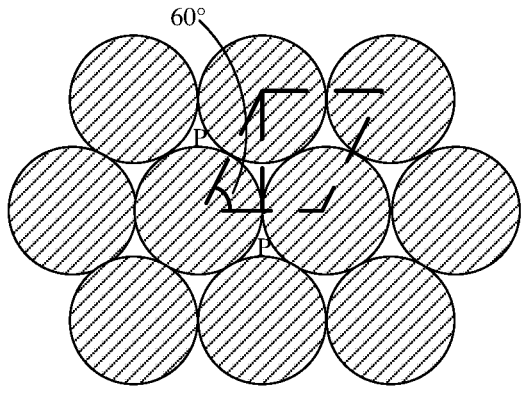
FIG. 1B is a second schematic diagram of comparison between an area of a storage unit of a tetragonal array structure and an area of a storage unit of a hexagonal close-packed structure according to an example.
Figure 2:
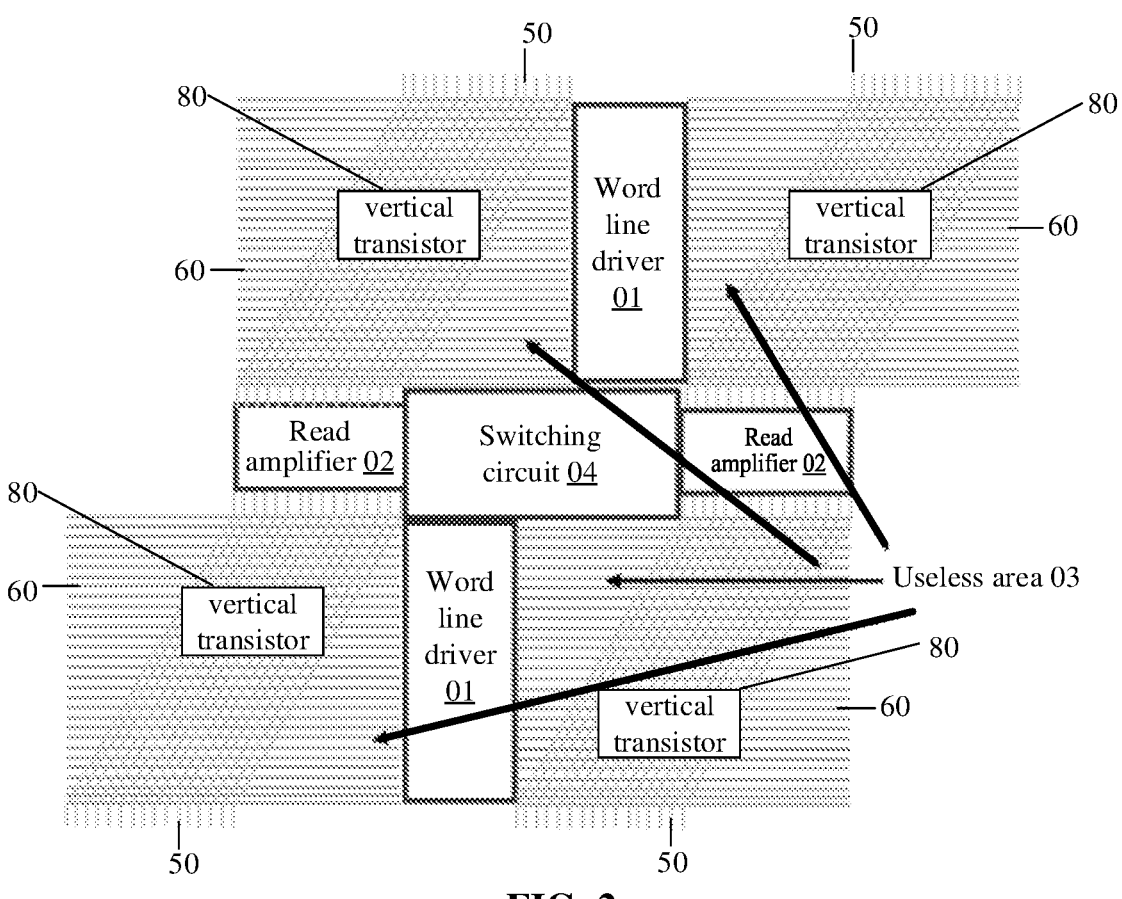
FIG. 2 is a schematic diagram of a hexagonal close-packed structure formed by making bit lines and word lines intersect at 60 degrees according to an example.

In the process of manufacturing a semiconductor structure, for example, vertical transistors in an array area of a DRAM storage unit often adopt a tetragonal arrangement structure. However, the tetragonal arrangement structure does not have the highest area efficiency, as shown in FIG. 1A, the cell area of the vertical transistors adopting the tetragonal arrangement structure is the square of a Pitch (P) of the vertical transistors. In some embodiments, a hexagonal close-packed arrangement shown in FIG. 1B may be adopted. The cell area of the vertical transistors adopting the hexagonal close-packed arrangement is P*P*sin60°. Compared with the tetragonal arrangement structure, adopting the hexagonal close-packed arrangement can reduce the area occupation by about 14% and increase the density of a memory. By adjusting the angle of a bit line, the bit line and a word line may intersect to form a second angle, for example, 60 degrees. The vertical transistor 80 may be arranged at the intersection of the word line and the bit line to form a hexagonal close-packed structure. However, simply making the bit line and the word line intersect to form a 60-degree angle may cause more waste of area. FIG. 2 shows a schematic diagram of a hexagonal close-packed structure formed by making bit lines and word lines intersect at 60 degrees. FIG. 2 shows four storage arrays and a switching circuit 04. The word line 60 in each storage array is connected to a word line driver 01, and the bit line 50 is connected to a read amplifier 02. The areas pointed by the arrows, namely the areas where the word lines and the bit lines do not intersect, are useless areas 03. The area S of the useless area 03 may be calculated by the following formula:

$$S = \frac{1}{2} * \tan 30 * (Pw1 * Nw1)2,$$

where Pw1 is the pitch of the word lines, and Nw1 is the number of the word lines. The ratio of the area S of the useless area 03 to the area of a single storage array is:

$$\tan 30 * (Pw1 * Nw1)/(Pb1 * Nb1),$$

where Pb1 is the pitch of the bit lines, and Nb1 is the number of the bit lines. Assuming that the word lines and the bit lines are identical in pitch and number, the proportion of the area S of the useless area 03 is about 58%. Such a high proportion of the area S of the useless area 03 is not acceptable in the design of semiconductor memory.

Therefore, in the embodiments of the present disclosure, it is necessary not only to adjust the angle of the bit line, but also to adjust the route of the bit line to a zigzag shape, so as to improve the above problem.

Figure 3:
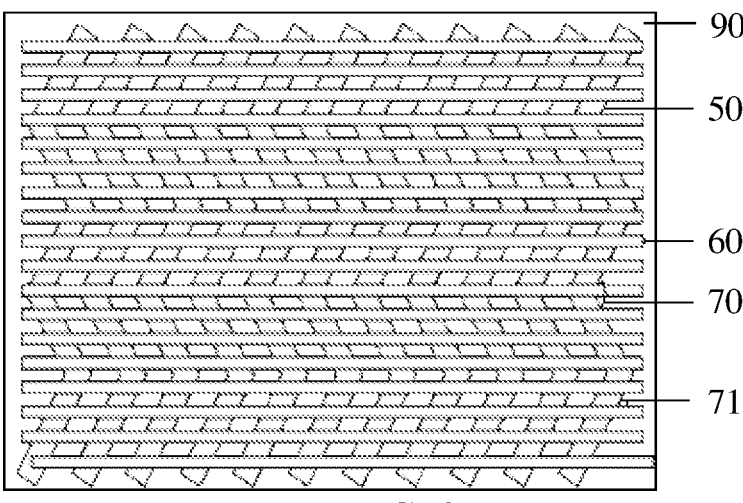
FIG. 3 is a schematic structural diagram of bit lines and word lines intersecting at a second angle and the bit lines being in a zigzag shape according to an embodiment of the present disclosure.

According to a first embodiment of the present disclosure, FIG. 3 shows a schematic structural diagram of a hexagonal close-packed arrangement of bit lines and word lines directly intersecting at a second angle and the bit lines being in a zigzag shape according to an embodiment of the present disclosure. The embodiment of the present disclosure provides a semiconductor structure, including:

a substrate 90, and a plurality of parallel word lines 60 and a plurality of parallel bit lines 50 on the substrate 90.

For each bit line 50, the bit line 50 is in a zigzag shape, each two adjacent segments among segments of the bit line 50 with the zigzag shape form a first angle 70, the bit line 50 has at least one first angle 70, and the bit line 50 intersects the word lines 60 to form a second angle 71.

In some embodiments, as shown in FIG. 3, the substrate 90 may include a silicon substrate, a germanium substrate, a gallium arsenide substrate, a gallium carbide substrate, a Silicon-On-Insulator (SOI) substrate, etc. Referring to FIG. 3, a plurality of parallel bit lines 50 may be first formed on the substrate 90. For each bit line 50, the bit line 50 is in a zigzag shape, each two adjacent segments among segments of the bit line 50 with the zigzag shape form a first angle 70, the bit line 50 has at least one first angle 70, and the bit line 50 intersects the word lines 60 to form a second angle 71.

Exemplarily, as shown in FIG. 2, a plurality of vertical transistors 80 may be arranged on the bit line 50, the vertical transistors 80 may be in a hexagonal close-packed arrangement, and the bottom end of each vertical transistor 80 is connected to the bit line 50.

Exemplarily, a plurality of parallel word lines 60 may be arranged, and each word line 60 may connect channel regions of the vertical transistors 80 on the plurality of bit lines 50, that is, the vertical transistor 80 may be arranged at the intersection of the word line 60 and the bit line 50.

Exemplarily, the top end of the vertical transistor 80 may be electrically connected to a memory, such as a capacitive memory, a magnetic memory, a resistive memory, and a phase change memory.

In some embodiments, the second angle 71 is in a range of 50 degrees to 70 degrees, for example, the second angle 71 is 60 degrees to facilitate the realization of hexagonal close-packed arrangement.

In some embodiments, a number of word lines intersected by each of the segments in the bit line 50 is L, and the L is greater than or equal to 2 and less than or equal to 10. FIG. 3 shows a schematic structural diagram of a hexagonal close-packed arrangement of bit lines 50 and word lines 60 intersecting at 60 degrees and the bit lines 50 being in a zigzag shape. In this case, the proportion of area of the useless area is:

$$[m/L * \frac{1}{2} * L * Pw1 * (\tan 30 * \frac{1}{2} * L * Pw1) * 2]/ \\ (m * n * Pw1 * Pb1),$$

where m is the total number of the word lines, n is the total number of the bit lines, L is the number of word lines intersected by a single segment of the zigzag line, Pw1 is the pitch of the word lines, and Pb1 is the pitch of the bit lines. If Pb1=Pw1, the proportion of area of the useless area is:

$$\frac{1}{2} * \tan 30 * L/n.$$

For example, when n is 1080, and L=10, the proportion of the useless area is only 0.2%. The smaller L is, the smaller the proportion of the useless area is. In this case, the design can greatly reduce the proportion of area of the useless area.

In some embodiments, the pitch of the word lines 60 is in a range of 35 nanometers (nm) to 45 nm, and L may be equal to 10. In this case, the length of a single segment may be long enough to allow the formation of a zigzag bit line pattern by using a single lithography process, thus reducing the difficulty of the process.

Figure 4:
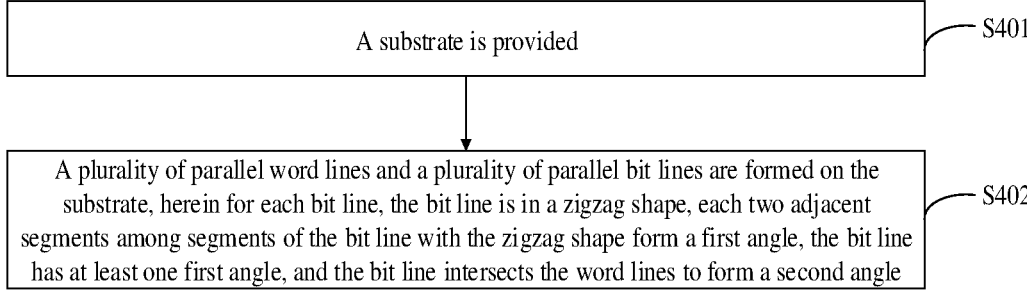
FIG. 4 is a flowchart of a method for manufacturing a semiconductor structure according to an embodiment of the present disclosure.
Figure 5:
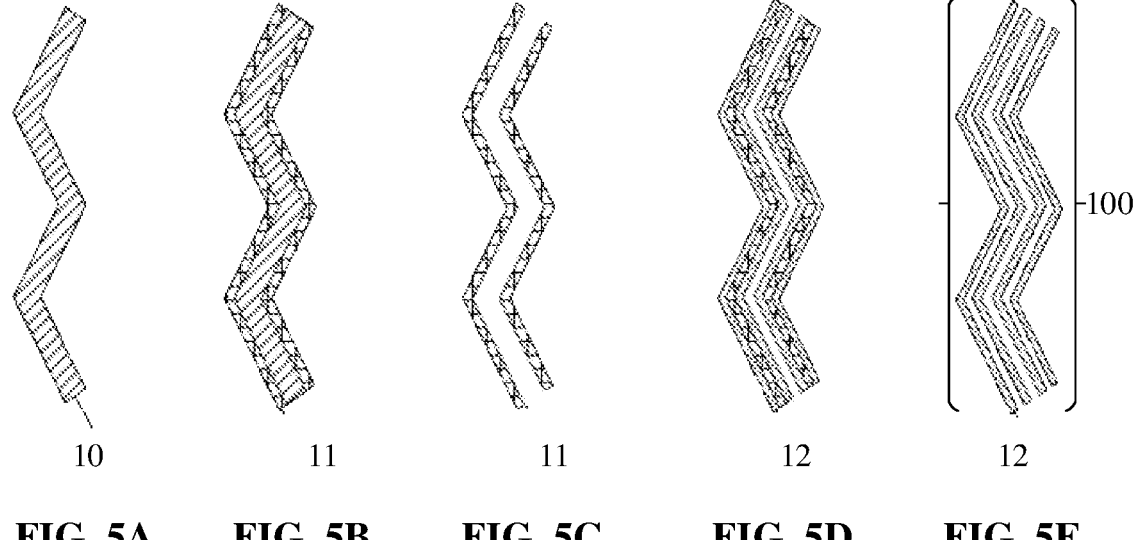
FIG. 5A illustrates a partial process of a method for forming bit lines according to an exemplary embodiment.
FIG. 5B illustrates a partial process of a method for forming bit lines according to an exemplary embodiment.
FIG. 5C illustrates a partial process of a method for forming bit lines according to an exemplary embodiment.
FIG. 5D illustrates a partial process of a method for forming bit lines according to an exemplary embodiment.
FIG. 5E illustrates a partial process of a method for forming bit lines according to an exemplary embodiment.

A second embodiment of the present disclosure provides a method for manufacturing a semiconductor structure, the flowchart of which is shown in FIG. 4. The method for manufacturing a semiconductor structure may include the following operations.

At S401, a substrate is provided.

At S402, a plurality of parallel word lines and a plurality of parallel bit lines are formed on the substrate, herein for each bit line, the bit line is in a zigzag shape, each two adjacent segments among segments of the bit line with the zigzag shape form a first angle, the bit line has at least one first angle, and the bit line intersects the word lines to form a second angle.

In some embodiments, the plurality of parallel bit lines are formed on the substrate may include the following operations. A bit line stack layer 100 is formed on the substrate. Exemplarily, the bit line stack layer 100 may include layers of tungsten, titanium nitride and polycrystalline silicon formed in sequence on the substrate. A photoresist bit line pattern with the zigzag shape is formed on the bit line stack layer 100 by using the lithography process. The bit lines are formed by using the photoresist bit line pattern, and an SADP or SAQP process. As shown in FIG. 5A to FIG. 5E, when the pitch of the word lines is in a range of 35 nm to 45 nm, and the number of word lines intersected by each of the segments is greater than or equal to 10, the photoresist pattern 10 shown in FIG. 5A may be formed by a single lithography process. A first sidewall layer 11 is formed on the sidewall of the photoresist pattern 10 by using the processes like atomic layer deposition. The photoresist pattern 10 is removed, and the bit line stack layer 100 is etched by using the first sidewall layer 11 to form the bit lines with the zigzag shape. In other examples, a second sidewall layer 12 may be formed on the sidewall of the first sidewall layer 11, then the first sidewall layer 11 is removed, and the bit line stack layer 100 is etched by using the second sidewall layer 12 to form the bit lines with the zigzag shape. The materials of the first sidewall layer 11 and the second sidewall layer 12 may include silicon oxide, etc.

In some embodiments, as shown in FIG. 6 to FIG. 10, the plurality of parallel bit lines are formed on the substrate may include the following operations.

A bit line stack layer is formed on the substrate, for example, stack layers which include layers of tungsten, titanium nitride and polycrystalline silicon are formed in sequence on the substrate.

A mask layer is formed on the bit line stack layer, for example, a silicon nitride or silicon oxide layer is formed on the bit line stack layer by chemical vapor deposition.

A first mask pattern is formed on the mask layer. The first mask pattern is intersected with a part of the word lines to form the second angle. Exemplarily, the first mask pattern includes a plurality of parallel first segments 21. The first segment 21 may be intersected with the word line formed later to form the second angle. The second angle may be 60 degrees. Here, the second angle may be defined as the acute angle formed by the first segment 21 intersecting with the word line.

A second mask pattern is formed on the mask layer. The second mask pattern is intersected with a part of the word lines to form the second angle. Exemplarily, the second mask pattern includes a plurality of parallel second segments 41. The second segment 41 may be intersected with the word line formed later to form the second angle. The second angle may be 60 degrees. Here, the second angle may be defined as the acute angle formed by the second segment 41 intersecting with the word line.

In some embodiments, the first segment 21 and the second segment 41 are identical in size and pitch.

In some embodiments, the first segments may be formed by the following operations.

Figure 6:
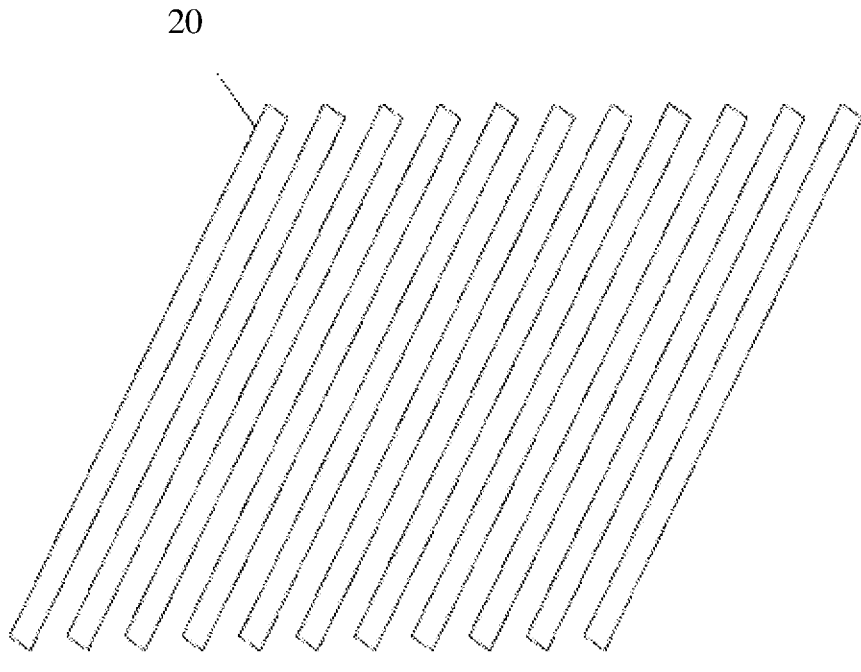
FIG. 6 illustrates a partial process of a method for forming bit lines according to another exemplary embodiment.

A first initial mask pattern is formed on the mask layer. The first initial mask pattern includes a plurality of parallel first lines 20, as shown in FIG. 6.

Figure 7:
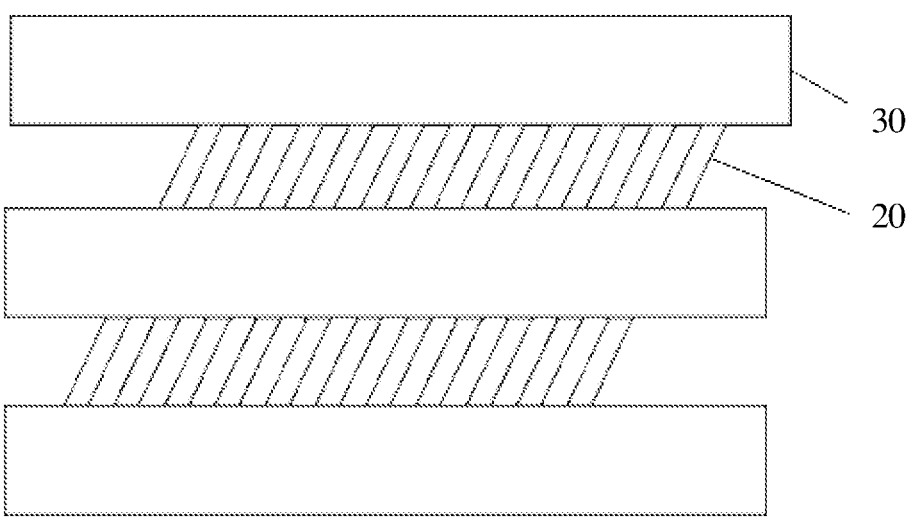
FIG. 7 illustrates a partial process of a method for forming bit lines according to another exemplary embodiment.

A first trimming mask layer is formed on the first initial mask pattern. The first trimming mask layer includes a plurality of parallel first trimming lines 30, as shown in FIG. 7, and an extension direction of the first trimming lines 30 is identical to an extension direction of the word lines.

Figure 8:
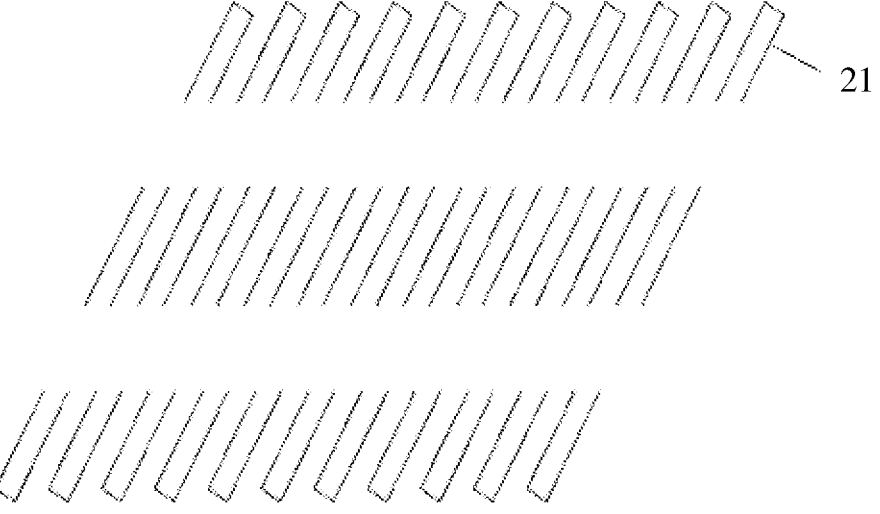
FIG. 8 illustrates a partial process of a method for forming bit lines according to another exemplary embodiment.

The first lines 20 are etched by using the first trimming lines 30, to trim the first lines 20 into the plurality of the first segments 21, as shown in FIG. 8.

Figure 9:
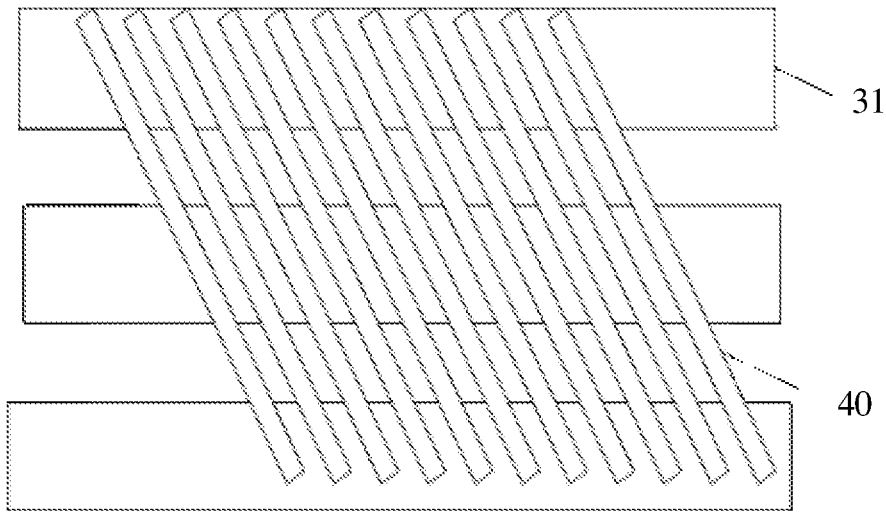
FIG. 9 illustrates a partial process of a method for forming bit lines according to another exemplary embodiment.

In some embodiments, as shown in FIG. 9, the second segments may be formed by the following operations.

A second trimming mask layer is formed on the first segments. The second trimming mask layer includes a plurality of parallel second trimming lines 31, and an extension direction of the second trimming lines 31 is identical to the extension direction of the word lines.

A second initial mask pattern is formed on the second trimming mask layer. The second initial mask pattern includes a plurality of parallel second lines 40.

The second lines 40 are trimmed into the plurality of the second segments 41 by using the second trimming lines 31.

Figure 10:
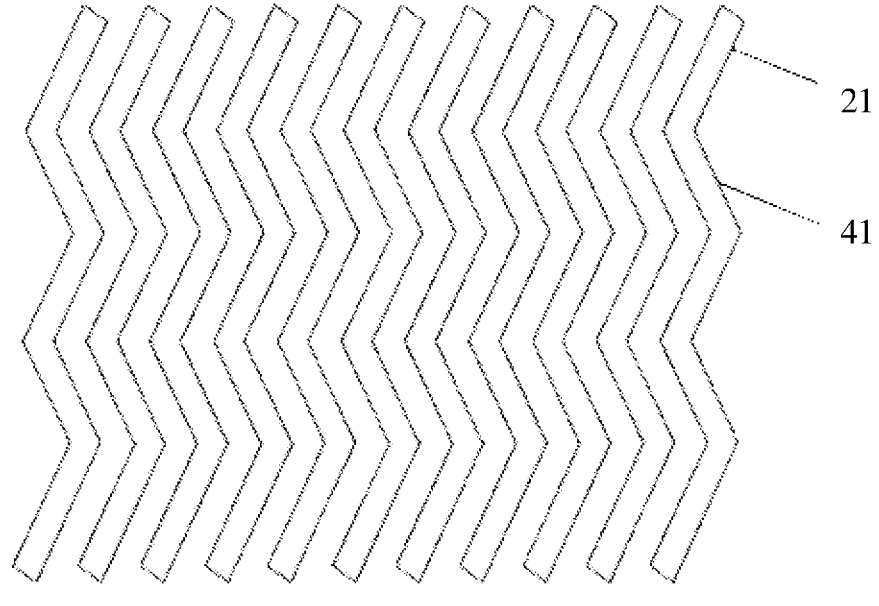
FIG. 10 illustrates a partial process of a method for forming bit lines according to another exemplary embodiment.

Exemplarily, the second trimming lines 31 overlay above the first segments 21. When using the second lines 40 for etching, due to the blocking of the second trimming lines 31, a part of the pattern of the second lines 40 will be transferred to the mask layer to form the second segments 41 as shown in FIG. 10.

In some embodiments, the first trimming lines 30 and the second trimming lines 31 are identical in size and pitch.

In some embodiments, the first lines or the second lines are formed by using the SADP process or the SAQP process.

In some embodiments, a plurality of vertical transistors may be arranged on the bit line, the vertical transistors may be in a hexagonal close-packed arrangement, and the bottom end of each vertical transistor is connected to the bit line.

In some embodiments, a plurality of parallel word lines may be arranged, and each word line may connect channel regions of the vertical transistors on the plurality of bit lines, that is, the vertical transistor may be arranged at the intersection of the word line and the bit line.

In some embodiments, the top end of the vertical transistor may be electrically connected to a memory, such as a capacitive memory, a magnetic memory, a resistive memory, and a phase change memory.

In conclusion, the present disclosure provides a semiconductor structure and a method for manufacturing a semiconductor structure. The word lines and the bit lines in the semiconductor structure are intersected, and the bit lines are arranged as zigzag lines, so that the vertical transistors arranged at the intersections are in a hexagonal close-packed arrangement, thus reducing the proportion of area of the useless area to avoid the waste of area.

It should be understood that the above embodiments of the present disclosure are used only to exemplify or explain the principle of the present disclosure and do not form a limit to the present disclosure. Therefore, any modifications, equivalent replacements, improvements and the like made without deviating from the spirit and scope of the present disclosure should fall within the scope of protection of the present disclosure. In addition, the claims attached to the present disclosure are intended to cover all variations and modifications falling within the scope and boundary of the attached claims, or equivalent forms of the scope and boundary. The operations in the method provided by the embodiments of the present disclosure may be sequentially adjusted, combined, and deleted as required.

A semiconductor structure provided by the embodiments of the present disclosure may at least include a plurality of parallel word lines and a plurality of parallel bit lines on a substrate. The word lines and the bit lines in the semiconductor structure are intersected, and the bit lines are arranged as zigzag lines, so that the vertical transistors arranged at the intersections are in a hexagonal close-packed arrangement, thus increasing the density of a memory, and reducing the proportion of area of the useless area to avoid the waste of area.

What is claimed is:

1. A method for manufacturing a semiconductor structure, comprising:
  providing a substrate; and
  forming a plurality of parallel word lines and a plurality of parallel bit lines on the substrate;
    wherein for each bit line, the bit line is in a zigzag shape, each two adjacent segments among segments of the bit line with the zigzag shape form a first angle, the bit line has at least one first angle, and the bit line intersects the word lines to form a second angle;
    the plurality of parallel bit lines are formed by:
    forming a bit line stack layer on the substrate;

forming a photoresist bit line pattern with the zigzag shape on the bit line stack layer by using a lithography process; and forming the bit lines by using:

the photoresist bit line pattern, and a Self-Aligned Double Patterning (SADP) process or a Self-Aligned Quadruple Patterning (SAQP) process;

a pitch of the word lines is in a range of 35 nm to 45 nm, and a number of word lines intersected by each of the segments is greater than or equal to 10;

wherein the plurality of parallel bit lines are formed by:

forming the bit line stack layer on the word lines;

forming a mask layer on the bit line stack layer;

forming a first mask pattern on the mask layer;

intersecting the first mask pattern with a part of the word lines to form the second angle; and forming a second mask pattern on the mask layer, and intersecting the second mask pattern with a part of the word lines to form the second angle, the first mask pattern intersecting the second mask pattern to form the first angle.

2. The method of claim 1, wherein the first mask pattern comprises a plurality of parallel first segments; and the second mask pattern comprises a plurality of parallel second segments; and the first segments and the second segments are identical in size and pitch.

3. The method of claim 2, wherein the first segments are formed by:

forming a first initial mask pattern on the mask layer, the first initial mask pattern comprising a plurality of parallel first lines;

forming a first trimming mask layer on the first initial mask pattern, the first trimming mask layer comprising a plurality of parallel first trimming lines, and an extension direction of the first trimming lines being identical to an extension direction of word lines; and etching the first lines by using the first trimming lines, to trim the first lines into the plurality of the first segments.

4. The method of claim 3, wherein the second segments are formed by:

forming a second trimming mask layer on the first segments, the second trimming mask layer comprising a plurality of parallel second trimming lines, and an extension direction of the second trimming lines being identical to the extension direction of the word lines;

forming a second initial mask pattern on the second trimming mask layer, the second initial mask pattern comprising a plurality of parallel second lines; and trimming the second lines into the plurality of the second segments by using the second trimming lines.

5. The method of claim 4, wherein the first trimming lines and the second trimming lines are identical in size and pitch.

6. The method of claim 4, wherein the first lines or the second lines are formed by using the SADP process or the SAQP process.

7. The method of claim 1, wherein the bit lines are formed before the word lines, and the method further comprises:

forming vertical transistors on the substrate, each vertical transistor being arranged at an intersection of a respective one of the word lines and a respective one of the bit lines, a bottom end of the vertical transistor being connected to the respective bit line, and a channel region of the vertical transistor being connected to the respective word line.

8. The method of claim 1, wherein the bit lines are formed before the word lines, and the method further comprises:

forming vertical transistors on the substrate, each vertical transistor being arranged at an intersection of a respective one of the word lines and a respective one of the bit lines, a bottom end of the vertical transistor being connected to the respective bit line, and a channel region of the vertical transistor being connected to the respective word line.

9. The method of claim 1, wherein the bit lines are formed before the word lines, and the method further comprises:

forming vertical transistors on the substrate, each vertical transistor being arranged at an intersection of a respective one of the word lines and a respective one of the bit lines, a bottom end of the vertical transistor being connected to the respective bit line, and a channel region of the vertical transistor being connected to the respective word line.

* * * * *